United States Patent
Jensen

(10) Patent No.: US 6,819,185 B1
(45) Date of Patent: Nov. 16, 2004

(54) AMPLIFIER BIASING

(75) Inventor: Brent R. Jensen, Portland, OR (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 10/294,808

(22) Filed: Nov. 13, 2002

Related U.S. Application Data

(63) Continuation of application No. 10/279,681, filed on Oct. 24, 2002, now abandoned.

(51) Int. Cl.[7] .............................................. H03F 3/04
(52) U.S. Cl. ................................................ 330/296
(58) Field of Search ................... 330/136, 285, 330/288, 296

(56) References Cited

U.S. PATENT DOCUMENTS

| | | | | |
|---|---|---|---|---|
| 5,216,379 A | * | 6/1993 | Hanley | 330/136 X |
| 5,654,672 A | * | 8/1997 | Bailey et al. | 330/296 X |
| 5,923,217 A | * | 7/1999 | Durec | 330/288 |

OTHER PUBLICATIONS

Schilling et al., Electronic Circuits Discrete and Integrated, $2^{nd}$ edition, McGraw–Hill 1979 pp. 361–162.*

* cited by examiner

Primary Examiner—Steven J. Mottola
(74) Attorney, Agent, or Firm—Blakeky Sokoloff Taylor & Zafman LLP

(57) ABSTRACT

A method and an apparatus are described for providing biasing for an amplifier. In an embodiment invention, a bias network comprises an integration circuit to sense a voltage change for an amplifier. The bias network adjusts a bias voltage for the amplifier in response to the voltage change.

12 Claims, 4 Drawing Sheets

Conventional Bias Network

AMPLIFIER BIASING

RELATED APPLICATION

This application is a continuation of U.S. patent application Ser. No. 10/279,681, entitled "Amplifier Biasing", filed Oct. 24, 2002, now abandoned.

FIELD OF THE INVENTION

The invention relates generally to the field of electronics. More particularly, the invention relates to amplifier biasing.

BACKGROUND

In amplifier design, a biasing circuit or network is intended to set and maintain the direct current (DC) bias point for the amplifier, allowing an amplifier to operate at an appropriate point in the amplifier's transfer characteristic. A bias network is intended to provide bias stability when there are variations in input signals, circuit parameters, or circuit conditions. The biasing circuit used for an amplifier will have significant effect on the operation of the amplifier.

However, conventional bias networks do not address all issues in amplifier operation and may not provide a DC bias point that is sufficiently stable and accurate under all circumstances. A conventional bias network may not sufficiently inhibit large signal de-biasing of the amplifier. Further, conventional bias networks may allow significant power gain variations as a function of input power, in which the power gain compresses as the input power is increased.

FIG. 1 is an illustration of a conventional bias network that may be used in a radio frequency (RF) power amplifier. Transistors $Q_1$ 125 and $Q_3$ 135 make up a simple current mirror reference for an RF power transistor $Q_2$ 170. $I_b$ 115 is a current source coupled between the current mirror and voltage source $V_{CC}$ 185. The bias current for $Q_2$ is provided by diode $Q_4$ 140 and resistor $R_2$ 145, with stability of the bias network being provided by dominant pole capacitor $C_3$ 120. For stability, a capacitor across $R_3$ 130 is sometimes also needed to provide feed-forward compensation. Resistor $R_1$ 150 is intended to provide RF isolation of the bias network and prevent loading of the input 105. The input is alternating current (AC) coupled to the base of transistor $Q_2$ 170 via capacitor $C_2$ 155.

In FIG. 1, the output collector of $Q_2$ 170 is biased with inductor $L_c$ 160, the other end of inductor $L_c$ 160 being coupled to voltage source $V_{CC}$ 185. The output port 110 will typically drive a 50-Ohm matching network. The emitter inductor $L_e$ 175 shown between the emitter of $Q_2$ 170 and ground 180 represents the package impedance, the inductance created by typical package ground impedance and/or bond wires. Resistor $R_3$ 130 is inserted between the base of $Q_1$ 125 and the emitter of $Q_3$ 135 to provide base current compensation. The voltage drop across $R_1$ is the base current error voltage $V_{err}=I_{b2}\times R_1$, where $I_{b2}$ is the base current of $Q_2$ 170. To compensate for this error voltage, the drop across $R_3$ should be equal to $V_{err}$ when the collector current of $Q_2$, $I_{c2}$ 165, is equal to a given multiple of the collector current of $Q_1$ $I_{c1}$ 190, $I_{c2}=M\times I_{c1}$. To provide such current at this point, the resistance of $R_3$ should be equal to the multiple of the resistance of $R_1$, $R_3=M\times R_1$.

The conventional bias network shown in FIG. 1 may provide stabilization of the DC bias point as a function of certain factors such as temperature and process variation, but such network does not operate to prevent de-biasing when large signals are imposed on the input port. This failure is due to non-linear rectification effects that occur as the output transistor $Q_2$ 170 transitions from small signal or Class A mode to large signal or Class B mode. The de-biasing effect also causes the power gain to compress (drop in value) at a lower input power level as the bias point sags. A further complication of the de-biasing effect with conventional biasing occurs in circuit design, in which long, time-consuming transient simulations may be needed to determine the final steady state, large signal response. The slow simulation process is the result of the slow settling time of the steady state bias point in operations with the conventional bias network.

BRIEF DESCRIPTION OF THE DRAWINGS

The present invention is illustrated by way of example, and not by way of limitation, in the figures of the accompanying drawings in which like reference numerals refer to similar elements, and in which.

DETAILED DESCRIPTION

Overview

Figure 1:
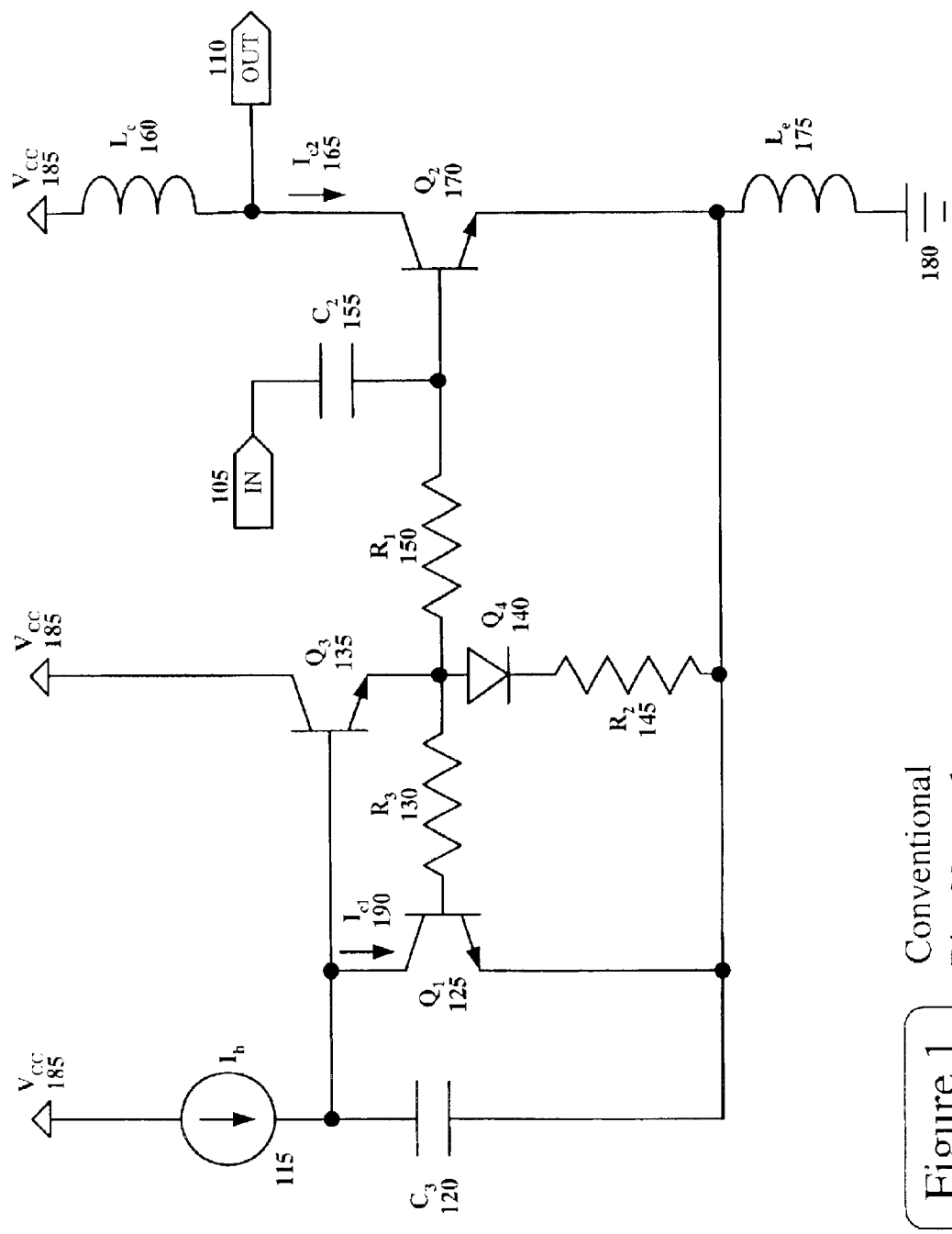
FIG. 1 is an illustration of a conventional bias network.

An embodiment of the present invention provides for biasing an amplifier. In one embodiment, a bias network comprises an integration circuit to sense a voltage change for an amplifier. The bias network adjusts a bias voltage for the amplifier in response to the voltage change.

Biasing

In one embodiment, a bias network includes an integration circuit to sense a voltage change for an amplifier, with the bias network adjusting the bias voltage for the amplifier in response to the voltage change. The integration circuit is configured to sense an average voltage between terminals of a transistor. In operation of an amplifier in which large input are driven into the input port, the diode nature of a transistor junction can cause a drop in the static DC bias voltage. The bias network senses the change and acts to force the bias voltage towards the proper potential. To describe the operation in a different manner, a change in input power for the amplifier is detected by the bias network. The bias network then adjusts the bias voltage in response to the change in input power. The bias voltage is adjusted to the appropriate voltage level independently of the supply voltage for the amplifier.

According to one embodiment, changes in input power for an amplifier are detected by comparing a feedback signal to a reference voltage. The comparison of the feedback signal to a reference voltage is performed by applying the reference voltage to a first input of an operational amplifier and applying the feedback signal to a second input of the operational amplifier. Described in another way, changes in input power are detected by integrating a voltage of the amplifier, with the integration being performed by an integration circuit.

According to one embodiment, an integration circuit for a bias network includes an operational amplifier, with a first input to the operational amplifier being coupled to receive the reference voltage and a second input to the operational amplifier being coupled to receive a feedback signal. The operational amplifier is configured to provide unity gain.

The operational amplifier may be coupled to a capacitor and a feedback resistor to form an integration circuit. If the reference voltage is applied to the non-inverting terminal of the operational amplifier, the capacitor is then coupled between the output of the operational amplifier and the inverting terminal of the operational amplifier. The feedback resistor is coupled between the inverting terminal of the operational amplifier and a terminal of the output transistor.

A bias network according to one embodiment may be utilized in an amplifier that is configured as an integrated circuit, but a bias network can be used in many different types of circuits, including circuits constructed using discrete electronic components. A bias network according to one embodiment has application in conjunction with RF power amplification, but the bias network is not limited to such operation and may be used with other types of amplifier circuits. The bias network may be applied in conjunction with varying transistor technologies, including but not limited to bipolar junction transistors (BJT, HBT—heterojunction bipolar transistors) and field effect transistors (FET, MESFET—metal semiconductor field effect transistors).

According to one embodiment, the bias network inhibits de-biasing of the amplifier as a function of input power, with the bias point for the amplifier remaining at an appropriate level as input power is increased. By resisting de-biasing, the bias network further inhibits power gain compression, in which the power gain of the amplifier is reduced with higher input power as the initial DC bias point drops. The operation of the bias network is especially useful in class B and class C amplifier operations, but also may be applied in other amplifiers. Under one embodiment, a gain compression point is increased without increasing the DC bias current for the amplifier. In addition, the time required for design of an amplifier may be reduced when utilizing the bias network because steady state operation is reached more quickly, thereby reducing the amount of simulation time needed.

Figure 2:
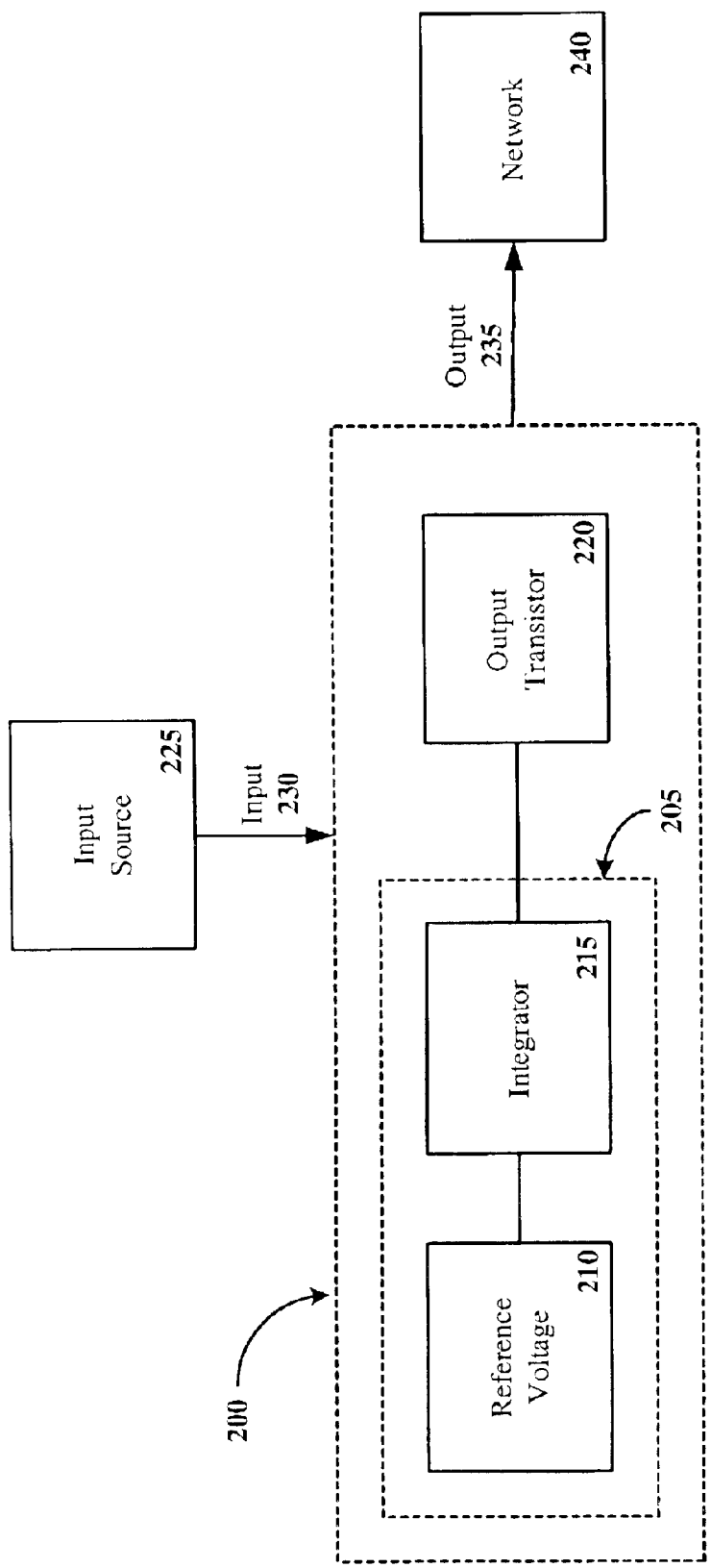
FIG. 2 is a block diagram illustrating an embodiment of a bias network.

FIG. 2 is a simplified block diagram illustrating an embodiment of a bias network. In this example, an amplifier 200 includes a bias network 205 and an output transistor 220, the bias network 205 providing a bias voltage for the output transistor 220. The bias network includes a reference source 210 and an integrator 215. Other details of the amplifier are omitted for simplicity. An input source 225 provides an input signal 230 to be amplified by the amplifier 200. An output signal 235 of the amplifier 200 is then fed to a network 240. The network 240 may be a 50-Ohm network, but operation is not limited to such a network. In this example, the integrator 215 receives a reference voltage from the reference source 210. The integrator 215 monitors a voltage of the output transistor 220 and compensates for changes in the voltage. In an example in which the output transistor 220 is a BJT, the monitored voltage is the voltage between the base and emitter ($V_{be}$) of the transistor. The bias network 205 adjusts the bias voltage in response to changes in the monitored voltage.

Figure 3:
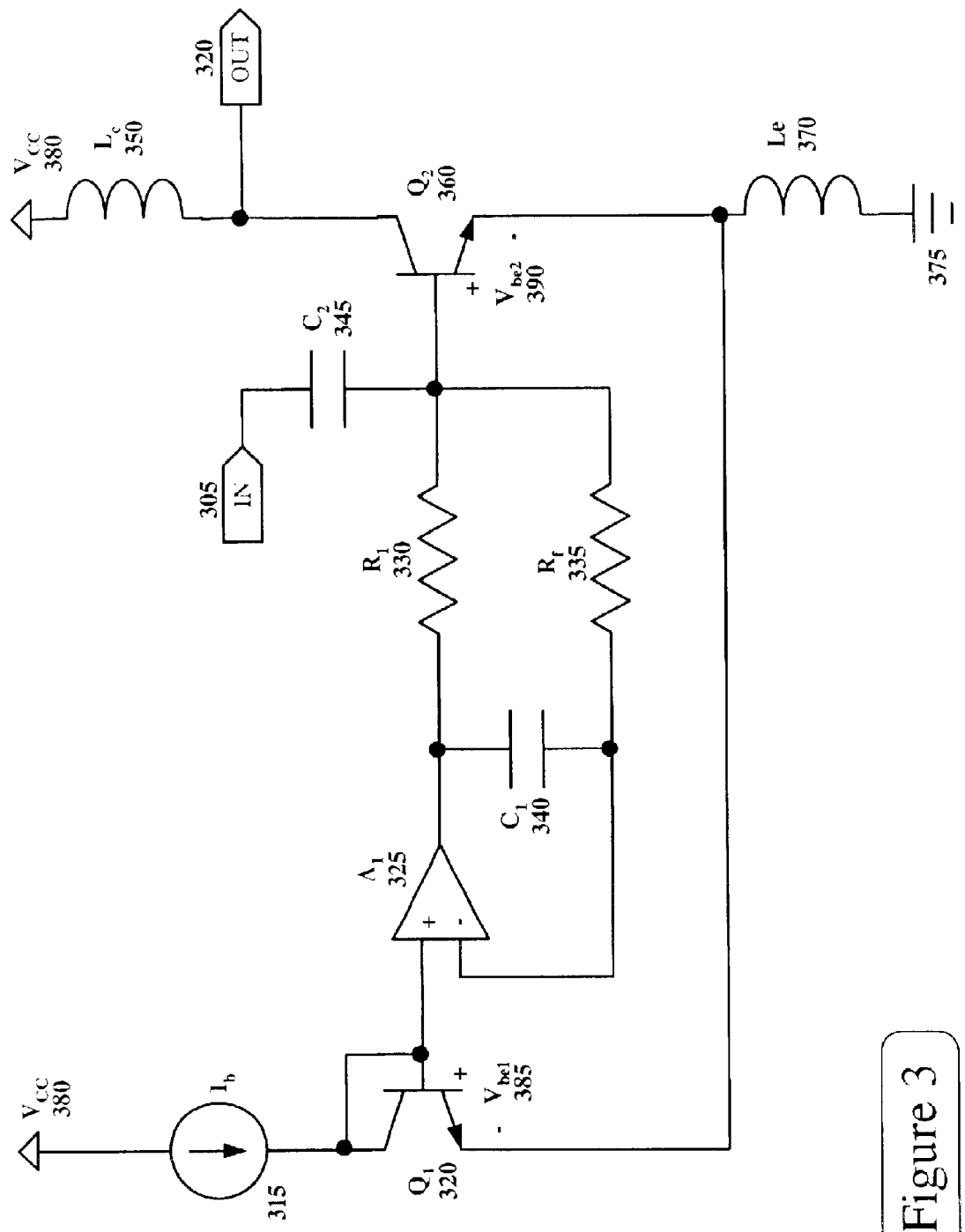
FIG. 3 is an illustration of an embodiment of a bias network for an amplifier.

FIG. 3 is an illustration of an embodiment of a bias network for an amplifier. The bias network may be used in conjunction with an integrated RF power amplifier, but is not limited to this application and a bias network may be used in other types of amplifiers and transistor technologies as well. In FIG. 3, a bias network provides a bias voltage for output transistor $Q_2$ 360, shown as an NPN BJT. In the illustrated embodiment, a diode-connected transistor $Q_1$ 320, with $Q_1$ being illustrated as an NPN BJT, and a current source $I_b$ 315 generate a reference voltage. $I_b$ 315 is coupled to the voltage source $V_{CC}$ 380. The reference voltage is $V_{be1}$ 385, the voltage across the base-emitter junction of transistor $Q_1$ 320. An operational amplifier $A_1$ 325 applies this voltage to the base of a power transistor $Q_2$ 360 via a feedback resistor $R_f$ 335. A base current error voltage is present, the error voltage essentially being $V_{err}=I_{b2} \times R_1$, where $I_{b2}$ is the base current of $Q_2$ 360. The error voltage across $R_f$ 335 can generally be ignored because the current through $R_f$ is very small compared to $I_{b2}$. The proper bias voltage is applied regardless of the size of the base current error voltage because of the unity gain feedback configuration for operational amplifier $A_1$ 325. Therefore, the illustrated circuit provides for DC base current error compensation in amplifier operation.

In the circuit illustrated in FIG. 3, resistor $R_1$ 330 provides RF isolation of the low impedance output of operational amplifier $A_1$ 325 to prevent loading the input 305. The input is AC coupled to the base of output transistor $Q_2$ 360 through capacitor $C_2$ 345. The output collector for the network is biased with inductor $L_c$ 350, with $L_c$ 350 being coupled to the voltage source $V_{CC}$ 380. The output port 320 may typically drive a 50-Ohm matching network, but the circuit is not limited to such operation. The emitter inductor $L_e$ 370 illustrated between the emitter of $Q_2$ 360 and ground 375 represents the package impedance, the inductance created by typical package ground impedance and/or bond wires.

The capacitor $C_1$ 340 and feedback resistor $R_f$ 335 form an integration function around the operational amplifier $A_1$ 325 for the purpose of inhibiting de-biasing of the output transistor $Q_2$ 360. This integrator network constantly senses the average base to emitter voltage $V_{be2}$ 390 of transistor $Q_2$ 360 under small and large RF signal conditions and compares such voltage to the reference voltage $V_{be1}$ 385. If the average $V_{be2}$ 390 tends to increase or decrease because of large signal non-linear effects, the operational amplifier loop compensates for the voltage change. The base bias regulation ensures that transistor $Q_2$ 360 remains solidly in class-B bias under high output power conditions and inhibits de-biasing of the amplifier. Further, $Q_2$ 360 can transition smoothly back to class-AB bias as input power is reduced.

Figure 4:
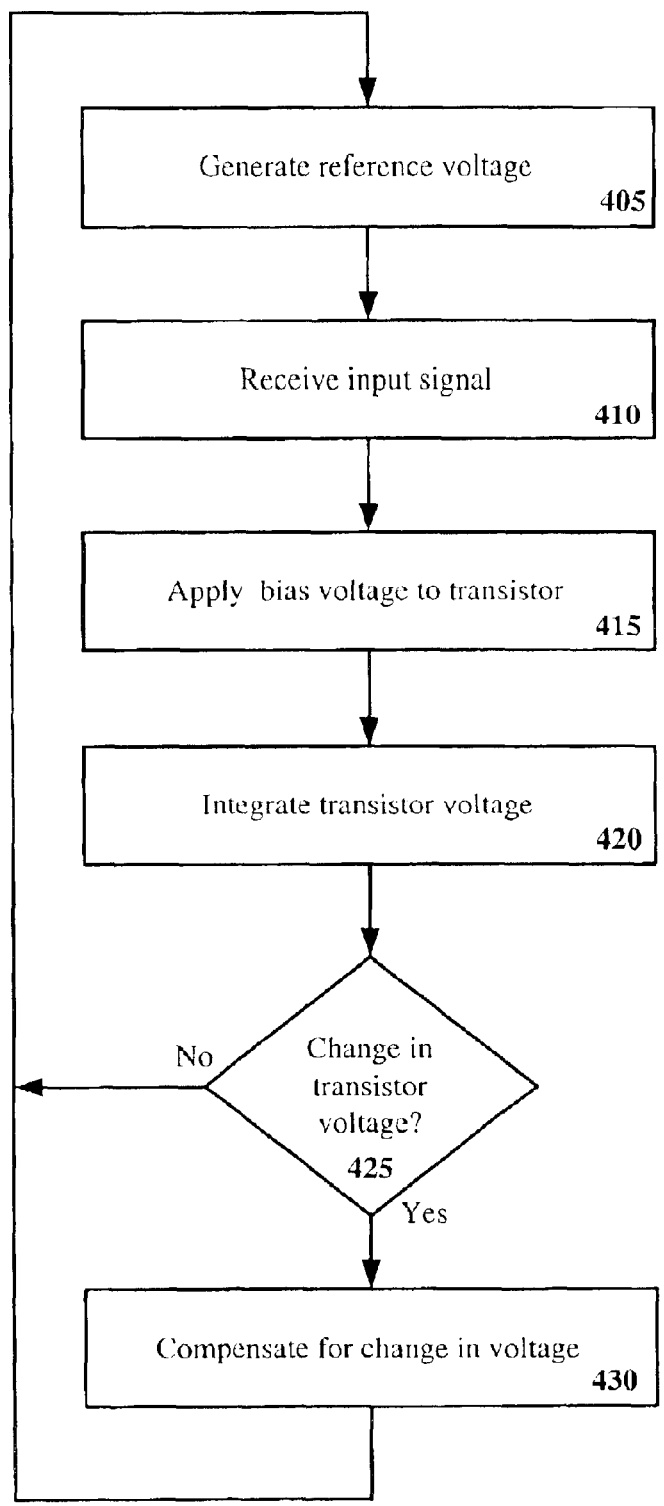
FIG. 4 is a flow diagram illustrating an embodiment of a process for biasing an amplifier.

FIG. 4 is a flow diagram illustrating an embodiment of a process for biasing an amplifier. The flow diagram does not include all processes in bias regulation, and breaks the bias network operation into conceptual units for illustration. In application in an operational circuit, the described processes occur at least in part simultaneously and continuously, and do not take the form of individual processes as shown in FIG. 4. A reference voltage is generated, 405, and an input signal is received, 410. A bias voltage is applied to an output transistor, 415. A transistor voltage is integrated using an integration circuit, 420. Expressed in another way, the input power to the amplifier is continuously monitored. If the average transistor voltage changes, 425, the integration circuit compensates for the change 430. The illustrated process then continues as the amplifier continues operation.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps. The steps of the present invention may be performed by hardware components or may be embodied in machine-executable instructions, which may be used to cause a general-purpose or special-purpose processor or logic circuits programmed with the instructions to perform the steps. Alternatively, the steps may be performed by a combination of hardware and software.

The present invention may be provided as a computer program product, which may include a machine-readable medium having stored thereon instructions, which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Many of the methods are described in their most basic form, but steps can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

What is claimed is:

1. A bias network for a transistor comprising:
    an operational amplifier having a first input and a second input;
    a capacitor, a first end of the capacitor being coupled with an output of the operational amplifier and a second end of the capacitor being coupled with the first input of the operational amplifier;
    a first resistor, a first end of the first resistor being coupled with the output of the operational amplifier and a second end of the first resistor being coupled to a first terminal of the transistor; and
    a second resistor, a first end of the second resistor being coupled with the first input of the operational amplifier and a second end of the feedback second resistor being coupled with the first terminal of the transistor;
    the bias network to detect a change in an average voltage of the transistor and adjust a bias voltage for the transistor in response to the voltage change.

2. The bias network of claim 1, wherein the second resistor is a feedback resistor.

3. The bias network of claim 2, wherein the operational amplifier is configured to provide unity gain.

4. The bias network of claim 3, wherein the second input of the operational amplifier is coupled to receive a reference voltage.

5. The bias network of claim 1, wherein an input to the transistor is coupled with the first terminal of the transistor.

6. The bias network of claim 5, wherein no ground connection is made to the first terminal of the transistor.

7. The bias network of claim 1, wherein the transistor is a bipolar junction transistor (BJT) and the first terminal of the transistor comprises the base of the transistor.

8. The bias network of claim 1, wherein the bias network acts to integrate the average voltage of the transistor.

9. An amplifier comprising:
    a transistor to receive a bias voltage at a first terminal of the transistor;
    a first resistor, a first end of the resistor being coupled to the first terminal of the transistor;
    an operational amplifier coupled with a second end of the first resistor, the operational amplifier to adjust the bias voltage in response to a change in a voltage of the transistor, the operational amplifier having a first input to receive a reference voltage and a second input to receive a feedback voltage;
    a capacitor coupled between an output of the operational amplifier and the second input of the operational amplifier; and
    a feedback resistor coupled between the second input of the operational amplifier and the first terminal of the transistor.

10. The amplifier of claim 9, wherein an input signal to the amplifier is to be received at the first terminal of the transistor.

11. The amplifier of claim 10, further comprising a circuit to produce the reference voltage, the circuit comprising a current source and a diode-connected transistor.

12. An amplifier comprising:
    a transistor to receive a bias voltage at a first terminal of the transistor;
    a first resistor, a first end of the resistor being coupled to the first terminal of the transistor; and
    an operational amplifier coupled with a second end of the first resistor, the operational amplifier to adjust the bias voltage in response to a change in a voltage of the transistor, the operational amplifier having a first input to receive a reference voltage and a second input to receive a feedback voltage;
    wherein adjusting the bias voltage in response to a change in the voltage of the transistor includes integrating the voltage of the transistor.

* * * * *